United States Patent
Sasakura et al.

(10) Patent No.: US 7,880,187 B2
(45) Date of Patent: Feb. 1, 2011

(54) SEMICONDUCTOR LIGHT EMITTING DEVICE HAVING NARROW RADIATION SPECTRUM

(75) Inventors: Ken Sasakura, Tokyo (JP); Keizo Kawaguchi, Tokyo (JP); Hanako Ono, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 0 days.

(21) Appl. No.: 11/241,310

(22) Filed: Sep. 30, 2005

(65) Prior Publication Data
US 2006/0071232 A1    Apr. 6, 2006

(30) Foreign Application Priority Data
Oct. 5, 2004    (JP)    ............... 2004-292326

(51) Int. Cl.
*H01L 29/06* (2006.01)
*H01L 31/00* (2006.01)
*H01L 33/00* (2006.01)

(52) U.S. Cl. ............... 257/96; 257/13; 257/14; 257/98; 257/99; 257/101; 257/102; 257/103; 257/E33.027; 257/E33.032; 257/E33.049; 257/E33.065; 438/29; 438/47

(58) Field of Classification Search ............... None
See application file for complete search history.

(56) References Cited
U.S. PATENT DOCUMENTS
6,298,079 B1 * 10/2001 Tanaka et al. ........... 372/46.01

6,444,485 B1 * 9/2002 Kidoguchi et al. ............ 438/31
2002/0145146 A1 * 10/2002 Shibata et al. ................ 257/79
2004/0069996 A1 * 4/2004 Maruyama et al. ............ 257/80

FOREIGN PATENT DOCUMENTS

| JP | 56-40287 | * | 4/1981 |
| JP | 56-040287 A | | 4/1981 |
| JP | 57-079683 A | | 5/1982 |
| JP | 03-013760 U | | 2/1991 |
| JP | 08-130327 A | | 5/1996 |
| JP | 10-022586 A | | 1/1998 |
| JP | 2002-344013 A | | 11/2002 |

OTHER PUBLICATIONS

BATOP Optoelectronics. Energy Band Gap for GaAs, AlGaAs and InGaAs. http://www.batop.de/informations/Eg_GaAs.html.*

(Continued)

*Primary Examiner*—Hoang-Quan T Ho
(74) *Attorney, Agent, or Firm*—Holtz, Holtz, Goodman & Chick, P.C.

(57) ABSTRACT

Radiation occurs when current is injected into an active layer from electrodes. A pair of clad layers is disposed sandwiching the active layer, the clad layer having a band gap wider than a band gap of the active layer. An optical absorption layer is disposed outside at least one clad layer of the pair of clad layers. The optical absorption layer has a band gap wider than the band gap of the active layer and narrower than the band gap of the clad layer. A spread of a spectrum of radiated light can be narrowed.

17 Claims, 5 Drawing Sheets

OTHER PUBLICATIONS

Preuss, Paul. An Unexpected Discovery Could Yield A Full Spectrum Solar Cell. Nov. 18, 2002. http://www.lbl.gov/Science-Articles/Archive/MSD-full-spectrum-solar-cell.html.*

BATOP Optoelectronics. Energy Band Gap for GaAs, AlGaAs and InGaAs. No publication date given, [online], [retrieved on Oct. 13, 2007]. Retrieved from the Internet: <URL:http://www.batop.de/informations/Eg_GaAs.html>.*

Preuss, Paul. An Unexpected Discovery Could Yield A Full Spectrum Solar Cell. Nov. 18, 2002, [online], [retrieved on Oct. 14, 2007]. Retrieved from the Internet: <URL:http://www.lbl.gov/Science-Articles/Archive/MSD-full-spectrum-solar-cell.html>.*

Japanese Office Action dated May 25, 2010 and English translation thereof in counterpart Japanese Application No. 2004-292326.

Japanese Office Action dated Oct. 19, 2010 (and English translation thereof) in counterpart Japanese Application No. 2004-292326.

* cited by examiner

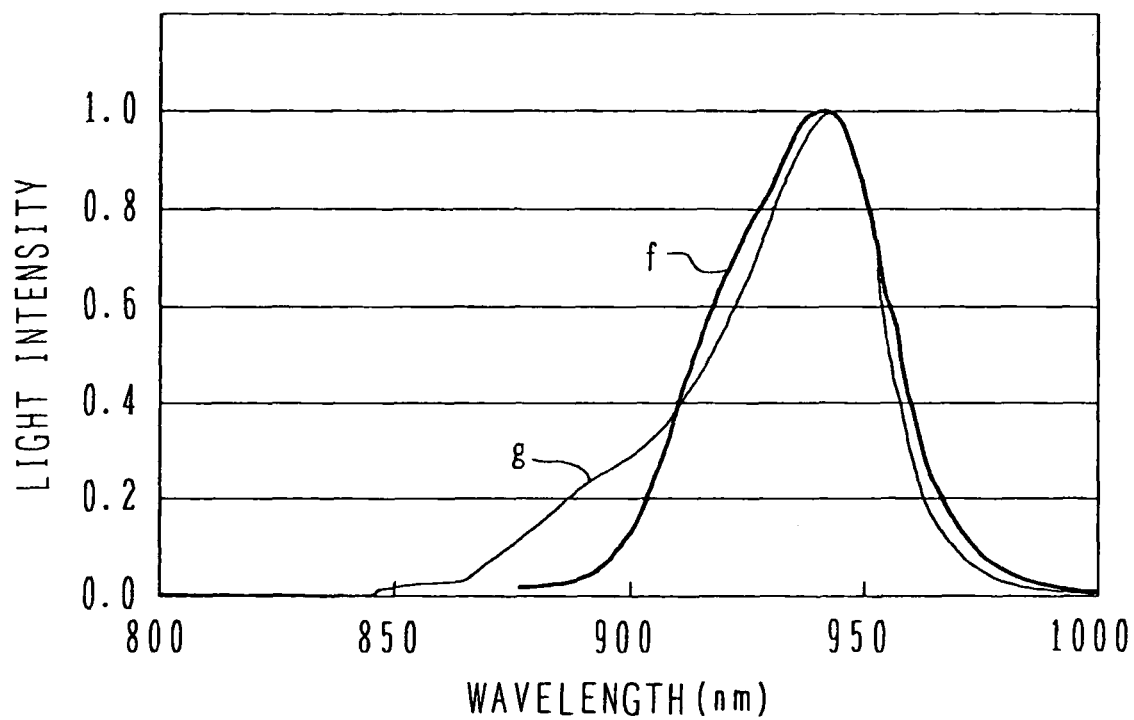

US 7,880,187 B2

SEMICONDUCTOR LIGHT EMITTING DEVICE HAVING NARROW RADIATION SPECTRUM

CROSS REFERENCE TO RELATED APPLICATION

This application is based on and claims priority of Japanese Patent Application No. 2004-292326 filed on Oct. 5, 2004, the entire contents of which are incorporated herein by reference.

BACKGROUND OF THE INVENTION

A) Field of the Invention

The present invention relates to a semiconductor light emitting device, and more particularly to a semiconductor light emitting device capable of narrowing the spread of a spectrum of radiated light.

B) Description of the Related Art

An infrared light emitting device can be manufactured by using semiconductor material having a band gap in an infrared range. JP-A-2002-344013 discloses a light emitting device for infrared spatial optical communications, using an InGaAs strain quantum well layer as an active layer. This light emitting device has the InGaAs strain quantum well layer sandwiched by a pair of AlGaAs carrier confinement layers, and this lamination structure is sandwiched by a p-type AlGaAs clad layer and an n-type AlGaAs clad layer.

A radiation spectrum of the light emitting device disclosed in JP-A-2002-344013 has a maximum intensity in an infrared wavelength range. However, a skirt of the spectrum spreads to the visual range. Therefore, radiated light from the light emitting device is slightly reddish. If radiated light contains visual light, the usage of the light emitting device is restricted. For example, this light emitting device cannot be used in the field prohibiting emission of visual light. If the spread of a spectrum of light radiated from the light emitting device can be narrowed, it is possible to suppress the generation of visual light.

SUMMARY OF THE INVENTION

An object of this invention is to provide a semiconductor light emitting device capable of narrowing the spread of a spectrum of radiated light.

According to one aspect of the present invention, there is provided a semiconductor light emitting device comprising: an active layer for emitting light upon injection of current; a pair of clad layers sandwiching the active layer, the clad layer having a band gap wider than a band gap of the active layer; an optical absorption layer disposed outside at least one clad layer of the pair of clad layers, the optical absorption layer having a band gap wider than the band gap of the active layer and narrower than the band gap of the clad layer; and electrodes for injecting current into the active layer.

According to another aspect of the present invention, there is provided a semiconductor light emitting device comprising: an active layer for emitting light upon injection of current; a pair of clad layers sandwiching the active layer; an optical absorption layer disposed outside at least one clad layer of the pair of clad layers, the optical absorption layer having a wavelength at which an absorption spectrum has a maximum value, shorter than a wavelength at which a radiation spectrum of the active layer has a maximum value and longer than a wavelength at which an intensity becomes 10% of the maximum value in a wavelength range shorter than a wavelength at which the radiation spectrum of the active layer has the maximum value; and electrodes for injecting current into the active layer.

According to still another aspect of the present invention, there is provided a semiconductor light emitting device comprising: an active layer having a quantum well structure with separated levels of heavy holes and light holes, the active layer providing radiation due to transition between the level of the heavy holes and a level of a conductive band and radiation due to transition between the level of the light holes and the level of the conductive band; a pair of clad layers sandwiching the active layer; an optical absorption layer disposed outside at least one clad layer of the pair of clad layers, the optical absorption layer having a band gap having a width between an energy difference between a base level of the heavy holes in the active layer and a base level of the conductive band and an energy difference between a base level of the light holes and the base level of the conductive band; and electrodes for injecting current into the active layer.

Light at a skirt of the spread of a spectrum of light generated in the active layer is absorbed by the optical absorption layer. The spread of a radiation light spectrum can therefore be suppressed.

BRIEF DESCRIPTION OF THE DRAWINGS

FIG. 5 is a graph showing a radiation spectrum of a semiconductor light emitting device according to a fourth embodiment.

DESCRIPTION OF THE PREFERRED EMBODIMENTS

Figure 1:
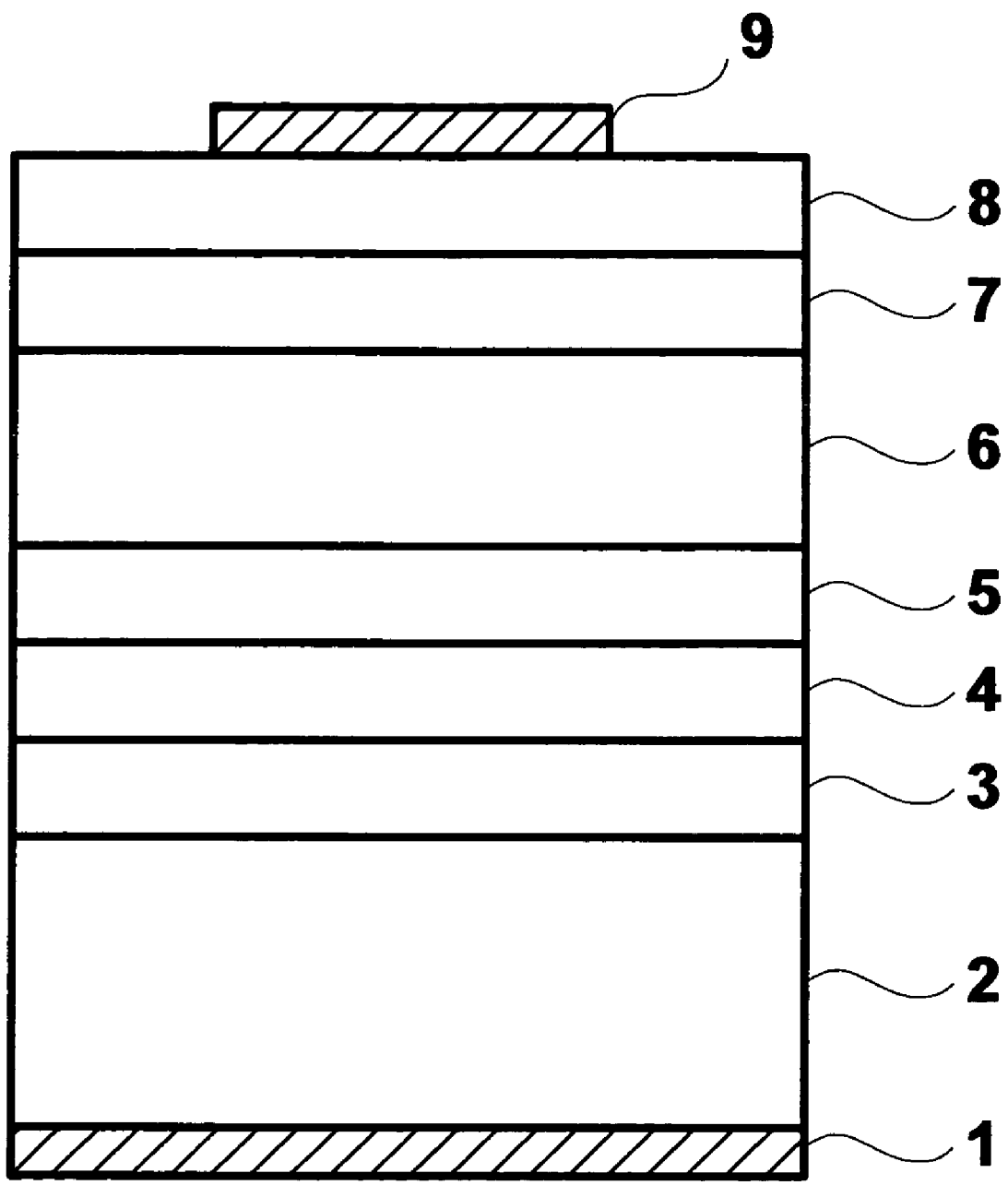
FIG. 1 is a schematic cross sectional view of a semiconductor light emitting device according to a first embodiment.

FIG. 1 is a schematic cross sectional view of a semiconductor light emitting device according to the first embodiment. On a principal surface of a semiconductor substrate 2 made of p-type GaAs, a lower clad layer 3, an active layer 4, an upper clad layer 5, a current spreading layer 6, an optical absorption layer 7 and a contact layer 8 are laminated in this order from the bottom.

The lower clad layer 3 is made of Zn- or Mg-doped p-type AlGaAs and has a thickness of 1 to 3 µm. A composition ratio of Al of the lower clad layer 3 is 0.3 to 0.4 and an impurity concentration is $1\times10^{16}$ cm$^{-3}$ to $1\times10^{18}$ cm$^{-3}$. The active layer 4 is made of p-type GaAs and has a thickness of 50 to 500 nm. An impurity concentration of the active layer 4 is $1\times10^{17}$ cm$^{-3}$ to $5\times10^{18}$ cm$^{-3}$.

The upper clad layer 5 is made of Si- or Se-doped n-type AlGaAs and has a thickness of 1 to 3 µm. A composition ratio of Al of the upper clad layer 5 is 0.3 to 0.4 and an impurity concentration is about $1\times10^{18}$ cm$^{-3}$. The current spreading layer 6 is made of n-type AlGaAs and has a thickness of 4.5 µm. An impurity concentration of the current spreading layer 6 is $1\times10^{16}$ cm$^{-3}$ to $1\times10^{18}$ cm$^{-3}$. A composition ratio of Al of the current spreading layer 6 is equal to that of the upper clad layer 5.

An optical absorption layer 7 is made of n-type AlGaAs and has a thickness of 0.1 µm or thicker and thinner than 5 µm.

An impurity concentration of the optical absorption layer 7 is about $1\times10^{18}$ cm$^{-3}$. A composition ratio of Al will be later described. The contact layer 8 is made of n-type GaAs and has a thickness of about 50 nm. An impurity concentration of the contact layer 8 is about $2\times10^{18}$ cm$^{-3}$.

These layers can be formed, for example, by Metal Organic Chemical Vapor Deposition (MOCVD).

A lower electrode 1 made of AuZn alloy is formed on the bottom surface of the semiconductor substrate 2. An upper electrode 9 made of AuGe alloy is formed on the upper surface of the contact layer 8. These electrodes are formed, for example, by vacuum vapor deposition. By injecting current into the active layer 4 from the upper and lower electrodes 9 and 1, radiation occurs in the active layer 4. The upper electrode 9 is patterned so that light generated in the active layer 4 can be output to an outer space.

Figure 2:
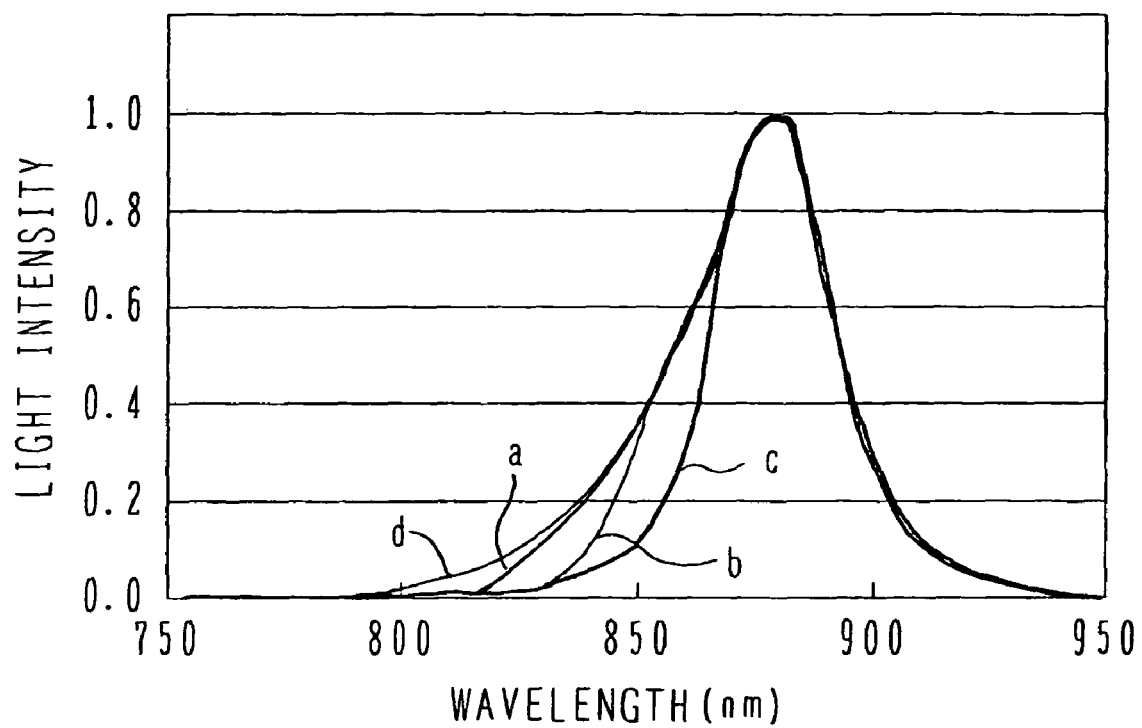
FIG. 2 is a graph showing a radiation spectrum of the semiconductor light emitting device of the first embodiment.

FIG. 2 shows a spectrum of light radiated from the semiconductor light emitting device shown in FIG. 1. The abscissa represents a wavelength in the unit of "nm", and the ordinate represents an optical intensity represented by a relative value by setting a maximum intensity to 1. Curves a, b and c shown in FIG. 2 show spectra with the composition ratios of Al of the optical absorption layer 7 being set to 0.1, 0.07 and 0.03, respectively. Differences between band gaps of the optical absorption layer 7 with the composition ratios of Al of the optical absorption layer 7 being set to 0.1, 0.07 and 0.03 and a band gap of the GaAs layer 4 are 0.11 eV, 0.072 eV and 0.031 eV, respectively. For the purpose of reference, a radiation spectrum of a light emitting device without the optical absorption layer 7 is shown by a curve d.

All the curves have the maximum intensity in the infrared range at the wavelength of about 880 nm. The wavelength at which the spectrum has the maximum value is called a "peak wavelength". It can be understood that the intensity lowers in a wavelength range shorter than the peak wavelength, by inserting the optical absorption layer 7. This is because the shorter wavelength components of light generated in the active layer 4 are absorbed in the optical absorption layer 7. As the Al composition ratio of the optical absorption layer 7 is made small, the wavelength at which the intensity starts lowering comes near the peak wavelength. This is because the peak of the absorption spectrum of the optical absorption layer 7 comes near the peak wavelength of the radiation spectrum of the active layer 4.

In the first embodiment, since both of the semiconductor substrate 2 and the active layer 4 are made of GaAs, the semiconductor substrate 2 absorbs light generated in the active layer 4. The contact layer 8 made of GaAs is completely removed by nitric acid during a chipping process.

In order to confine carriers in the active layer 4 and sufficiently transmit light generated in the active layer 4, the lower clad layer 3 and upper clad layer 5 are made of semiconductor having a band gap wider than that of the active layer 4. A band gap of the optical absorption layer 7 is wider than that of the active layer 4 and narrower than those of the upper clad layer 5 and lower clad layer 3. Therefore, the optical absorption layer 7 absorbs a component of light generated in the active layer 4 and having a wavelength in a range shorter than the peak wavelength. Since the band gap of the optical absorption layer 7 is wider than that of the active layer 4, light at the peak wavelength in the radiation spectrum has a smaller attenuation amount in the optical absorption layer 7 than light in a wavelength range shorter than the peak wavelength, and is efficiently radiated to an outer space.

If a difference between the band gap of the optical absorption layer 7 and the band gap of the active layer 4 is too large, light at the skirt of the radiation spectrum on the shorter wavelength side is hardly absorbed. It is preferable to set the band gap of the optical absorption layer 7, for example, narrower than the band gap corresponding to the wavelength at which the intensity of the radiation spectrum becomes 10% of the maximum intensity in a wavelength range shorter than the peak wavelength. In other words, it is preferable that the peak wavelength of an absorption spectrum of the optical absorption layer 7 is shorter than the peak wavelength of the radiation spectrum of the active layer 4, and longer than the wavelength at which the intensity becomes 10% of the highest intensity in the wavelength range shorter than the peak wavelength. Generally, a luminosity factor becomes higher at a shorter wavelength. It is therefore possible to increase the effects of reducing red light components by absorbing the components at the skirt on the shorter wavelength side of the radiation spectrum.

The effects of absorbing components in the visual range can be recognized even if a difference between the band gap of the optical absorption layer 7 and the band gap of the active layer 4 becomes large to 0.11 eV as shown by the curve a shown in FIG. 2. It is possible to increase the effects of narrowing a spread of the radiation spectrum, if the band gap difference is 0.11 eV or smaller.

If the optical absorption layer 7 is too thin, sufficient optical absorption is not effected. It is preferable to set a thickness of the optical absorption layer 7 to 0.1 µm or thicker. If the optical absorption layer 7 is too thick, the intensity of externally radiated light becomes too weak. A thickness of the optical absorption layer 7 is preferably thinner than 5 µm.

Next, with reference to FIG. 3, description will be made on a semiconductor light emitting device according to the second embodiment. In the first embodiment, the active layer 4 shown in FIG. 1 is made of p-type GaAs, whereas in the second embodiment, it is made of p-type InGaAs. The other structures are the same as those of the first embodiment.

Figure 3:
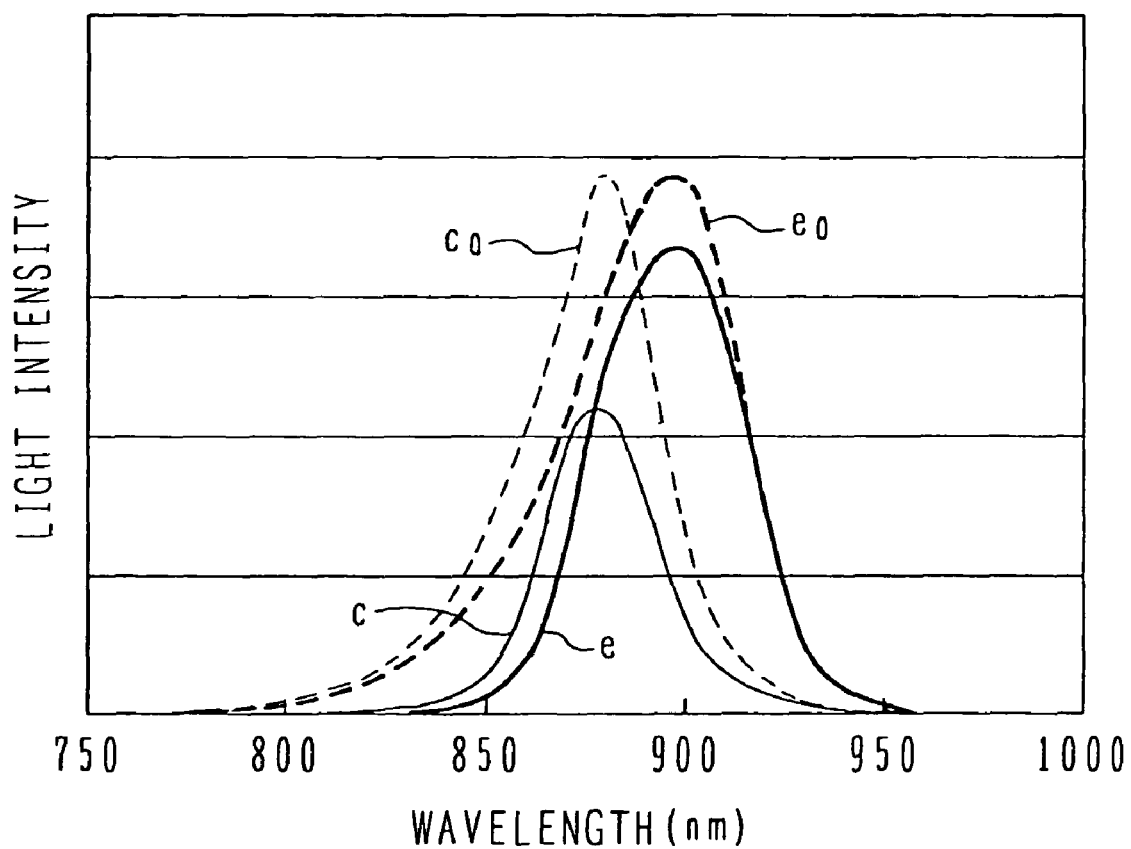
FIG. 3 is a graph showing a radiation spectrum of a semiconductor light emitting device according to a second embodiment.

FIG. 3 shows a radiation spectrum of the semiconductor light emitting device of the second embodiment. A curve e shows the radiation spectrum of the semiconductor light emitting device of the second embodiment. An In composition ratio of the active layer 4 was set to 0.045 and an Al composition ratio of the optical absorption layer 7 was set to 0.03. For the purposes of comparison, the radiation spectrum of the semiconductor light emitting device of the first embodiment is shown by a curve c. Broken lines $c_0$ and $e_0$ show the radiation spectra of semiconductor light emitting devices without the optical absorption layer of the first and second embodiments. The ordinate represents an optical intensity in a relative scale by setting the highest values of the broken lines $c_0$ and $e_0$ to 1.

Since a band gap of InGaAs is narrower than that of GaAs, the peak wavelength of the radiation spectrum of the semiconductor light emitting device of the second embodiment shifts toward a longer wavelength side than the peak wavelength of the radiation spectrum of the semiconductor light emitting device of the first embodiment. In the second embodiment, the optical absorption layer 7 absorbs mainly the components at the skirt on the shorter wavelength side of the radiation spectrum (corresponding to the broken line $e_0$) of the active layer 4 before the absorption by the optical absorption layer, and has a smaller absorption amount in the wavelength range near the peak wavelength. An optical intensity of externally radiated light is about 88% of the optical intensity of that of the device without the optical absorption layer.

In contrast, the first embodiment has a large absorption amount even in the wavelength range near the peak wavelength of the spectrum (corresponding to the broken line $c_0$)

of the active layer 4 before the absorption by the optical absorption layer 7. Therefore, as compared to the first embodiment, the second embodiment has a small attenuation amount by the absorption by the optical absorption layer 7. In the first embodiment, the optical intensity of externally radiated light was about 51% of the optical intensity of that of the device without the optical absorption layer 7. As described above, light output efficiency can be increased by shifting the radiation spectrum of the active layer 4 to the longer wavelength side. The red light components of externally radiated light can be reduced greatly.

An In composition ratio and thickness of the active layer 4 are set to such a degree that the active layer can be epitaxially grown on the substrate. If the In composition ratio is set too large, a critical thickness of epitaxial growth becomes thin. It is therefore preferable to set the In composition ratio to 0.25 or smaller.

Figure 4:
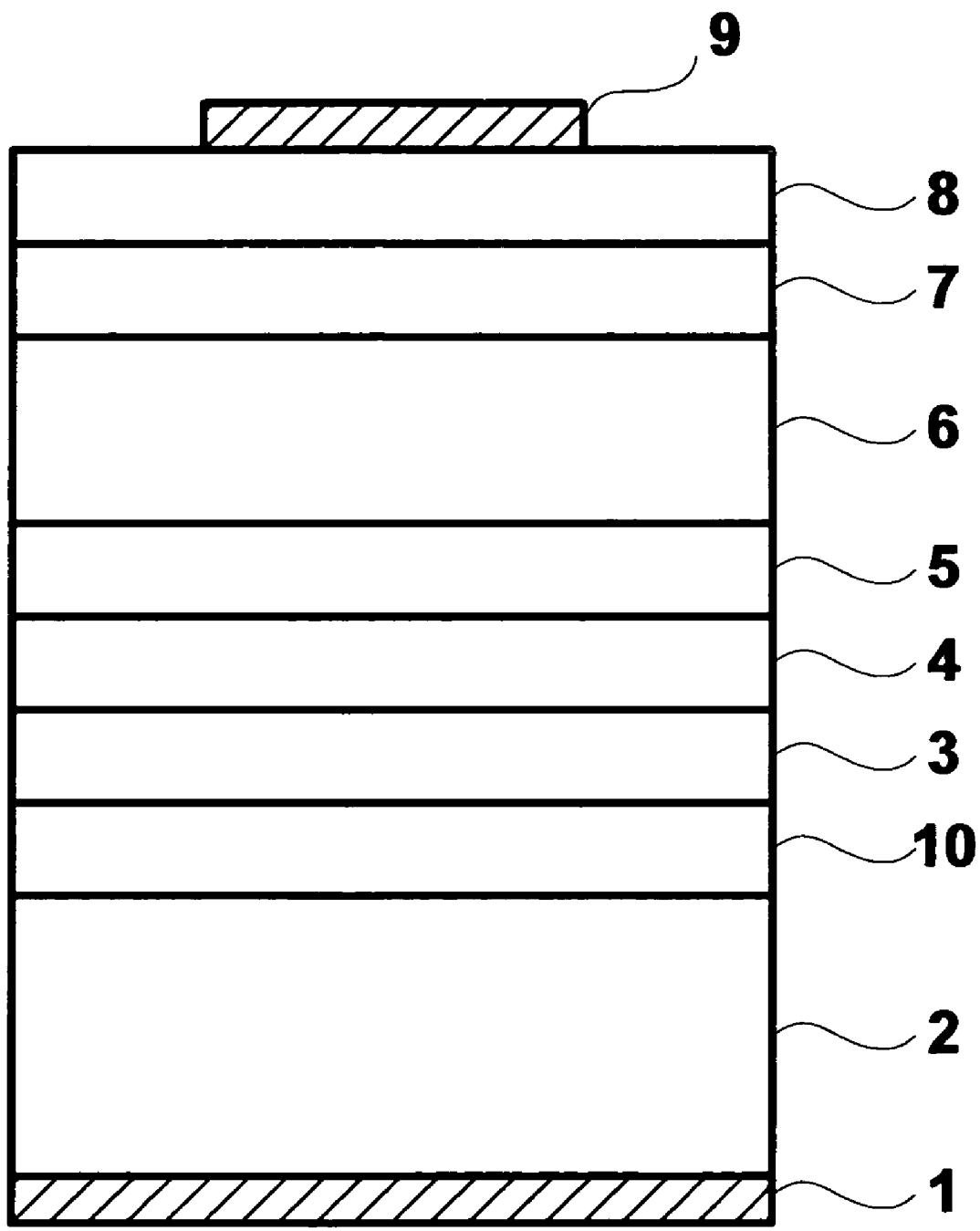
FIG. 4 is a schematic cross sectional view of a semiconductor light emitting device according to a third embodiment.

FIG. 4 is a schematic cross sectional view of a semiconductor light emitting device according to the third embodiment. Description will be made on different points from the semiconductor light emitting device of the first embodiment shown in FIG. 1. In the third embodiment, a semiconductor substrate 2 is made of material transparent to light in the radiation wavelength range of an active layer 4, such as AlGaAs, GaP and sapphire. Therefore, light generated in the active layer 4 is externally radiated also through the semiconductor substrate 2. In order to narrow the spread of a spectrum of light radiated through the semiconductor substrate 2, an optical absorption layer 10 is inserted also between the semiconductor substrate 2 and a lower clad layer 3. The optical absorption layer 10 is made of p-type AlGaAs and has the same composition ratio as that of an upper optical absorption layer 7.

Next, description will be made on a semiconductor light emitting device according to the fourth embodiment. The semiconductor light emitting device of the fourth embodiment uses a quantum well structure as the active layer 4 of the semiconductor light emitting device of the third embodiment shown in FIG. 4. More specifically, the active layer 4 has the structure that a well layer made of InGaAs and having a thickness of 6 nm is sandwiched between a pair of barrier layers each made of AlGaAs and having a thickness of 50 nm. An In composition ratio of the well layer is 0.18 and an Al composition ratio of the barrier layer is 0.18.

FIG. 5 shows radiation spectra of semiconductor light emitting devices of the fourth embodiment and a comparative example. A curve f shown in FIG. 5 indicates the radiation spectrum of the semiconductor light emitting device of the fourth embodiment. A curve g indicates the radiation spectrum of the semiconductor light emitting device of the comparative example not having the optical absorption layers 7 and 10 shown in FIG. 4. The radiation spectrum has the maximum value at a wavelength of about 940 nm. This peak wavelength corresponds to transition requiring a level of heavy holes. The skirt on the shorter wavelength side of the radiation spectrum of the semiconductor light emitting device of the comparative example extends to the wavelength range farther from the peak wavelength than the skirt of the longer wavelength side. This is because radiation occurs due to transition requiring a level of light holes.

It can be understood that light at the skirt on the shorter wavelength side can be efficiently absorbed and a spread of the skirt can be suppressed, by disposing the optical absorption layers 7 and 10. It is therefore possible to efficiently attenuate the visual components of light generated in the active layer 4. Coloring of externally radiated light can therefore be suppressed.

In order to efficiently absorb light generated due to the level of light holes, it is preferable to select material of the optical absorption layers 7 and 10 so that the band gaps of the optical absorption layers 7 and 10 become wider than an energy difference between a base level of heavy holes in the active layer 4 and a base level of the conductive band, and narrower than an energy difference between a base level of light holes and a base level of the conductive band.

If tensile strain exists in the quantum well layer, a transition wavelength between the conductive band and the base level of light holes becomes longer than a transition wavelength between the conductive band and the base level of heavy holes. In this case, it is preferable to select material of the optical absorption layers 7 and 10 so that the band gaps of the optical absorption layers 7 and 10 become narrower than an energy difference between a base level of heavy holes in the active layer 4 and a base level of the conductive band, and wider than an energy difference between a base level of light holes and a base level of the conductive band.

Namely, in the above-described two cases, it is preferable to select material of the optical absorption layers 7 and 10 so that the band gaps of the optical absorption layers 7 and 10 are between an energy difference between a base level of heavy holes in the active layer 4 and a base level of the conductive band and an energy difference between a base level of light holes and a base level of the conductive band.

In this embodiment, although a thickness of the well layer was set to 6 nm and a thickness of the barrier layer was set to 50 nm, a thickness of the well layer may be set to 2 to 20 nm and a thickness of the barrier layer may be set to 10 to 200 nm. A multiple quantum well structure having a plurality of well layers may be used. The active layer 4 of the lamination structure shown in FIG. 1 may be a quantum well structure.

In the first to fourth embodiments, if the peak wavelength of a radiation spectrum of the active layer is in the infrared range, an optical absorption layer having a peak wavelength of an absorption spectrum in the visual range is disposed so that coloring of externally radiated light can be suppressed.

In the above-described embodiments, radiation in the infrared range has been described. The technical concept of the first to fourth embodiments may be applied to semiconductor light emitting devices having radiation in other wavelength ranges. For example, a blue light emitting diode may be provided with an optical absorption layer absorbing light in ultraviolet wavelength ranges, to suppress radiation of ultraviolet rays to an outer space.

The present invention has been described in connection with the preferred embodiments. The invention is not limited only to the above embodiments. It will be apparent to those skilled in the art that other various modifications, improvements, combinations, and the like can be made.

What we claim are:

1. A semiconductor light emitting device comprising:
    an active layer for emitting light upon injection of current;
    a pair of clad layers sandwiching the active layer, the pair of clad layers having a band gap that is wider than a band gap of the active layer;
    at least one optical absorption layer disposed outside at least one clad layer of the pair of clad layers, the light emitted by the active layer being output to outside of the semiconductor light emitting device through the optical absorption layer, and the optical absorption layer having a band gap that is wider than the band gap of the active layer and narrower than the band gap of the pair of clad layers; and electrodes for injecting the current into the active layer;
wherein one of the electrodes is disposed outside the optical absorption layer and is patterned so that light generated in the active layer can be output to an outer space through the optical absorption layer;
wherein the band gap of the optical absorption layer is narrower than a band gap corresponding to a wavelength, which is shorter than a wavelength at which a radiation spectrum of the active layer has a maximum value, and at which an intensity of the radiation spectrum of the active layer is 10% of the maximum value of the radiation spectrum of the active layer;
wherein the wavelength at which the radiation spectrum of the active layer has the maximum value is an infrared range; and
wherein the active layer is made of InGaAs and the optical absorption layer is made of AlGaAs.

2. A semiconductor light emitting device comprising:
an active layer for emitting light upon injection of current;
a pair of clad layers sandwiching the active layer, the pair of clad layers having a band gap that is wider than a band gap of the active layer;
at least one optical absorption layer disposed outside at least one clad layer of the pair of clad layers, the light emitted by the active layer being output to outside of the semiconductor light emitting device through the optical absorption layer, and the optical absorption layer having a band gap that is wider than the band gap of the active layer and narrower than the band gap of the pair of clad layers; and
electrodes for injecting the current into the active layer;
wherein one of the electrodes is disposed outside the optical absorption layer and is patterned so that light generated in the active layer can be output to an outer space through the optical absorption layer;
wherein the band gap of the optical absorption layer is narrower than a band gap corresponding to a wavelength, which is shorter than a wavelength at which a radiation spectrum of the active layer has a maximum value, and at which an intensity of the radiation spectrum of the active layer is 10% of the maximum value of the radiation spectrum of the active layer;
wherein the wavelength at which the radiation spectrum of the active layer has the maximum value is an infrared range;
wherein the active layer has a quantum well structure with separated levels of heavy holes and light holes, the active layer providing radiation due to transition between the level of the heavy holes and a level of a conductive band and radiation due to transition between the level of the light holes and the level of the conductive band; and
wherein the band gap of the optical absorption layer has a width between an energy difference between a base level of the heavy holes in the active layer and a base level of the conductive band and an energy difference between a base level of the light holes and the base level of the conductive band.

3. A semiconductor light emitting device comprising:
an active layer for emitting light upon injection of current;
a pair of clad layers sandwiching the active layer, the pair of clad layers having a band gap that is wider than a band gap of the active layer;
at least one optical absorption layer disposed outside at least one clad layer of the pair of clad layers, the light emitted by the active layer being output to outside of the semiconductor light emitting device through the optical absorption layer, and the optical absorption layer having a band gap that is wider than the band gap of the active layer and narrower than the band gap of the pair of clad layers; and
electrodes for injecting the current into the active layer;
wherein one of the electrodes is disposed outside the optical absorption layer and is patterned so that light generated in the active layer can be output to an outer space through the optical absorption layer;
wherein the band gap of the optical absorption layer is narrower than a band gap corresponding to a wavelength, which is shorter than a wavelength at which a radiation spectrum of the active layer has a maximum value, and at which an intensity of the radiation spectrum of the active layer is 10% of the maximum value of the radiation spectrum of the active layer;
wherein the wavelength at which the radiation spectrum of the active layer has the maximum value is an infrared range; and
wherein the active layer is made of GaAs and the optical absorption layer is made of AlGaAs.

4. A semiconductor light emitting device comprising:
an active layer for emitting light upon injection of current;
a pair of clad layers sandwiching the active layer, the pair of clad layers having a band gap that is wider than a band gap of the active layer;
a semiconductor substrate over which the active layer and the pair of clad layers are disposed;
first and second optical absorption layers, the first optical absorption layer being disposed over an upper one of the pair of clad layers, and the second optical absorption layer being provided between a lower one of the pair of clad layers and the semiconductor substrate, the light emitted by the active layer being output to outside of the semiconductor light emitting device through the first optical absorption layer, and each of the first and second optical absorption layers having a band gap that is wider than the band gap of the active layer and narrower than the band gap of the pair of clad layers; and
electrodes for injecting the current into the active layer;
wherein one of the electrodes is disposed over the first optical absorption layer and is patterned so that light generated in the active layer can be output to an outer space through the first optical absorption layer;
wherein the band gap of the first and second optical absorption layers is narrower than a band gap corresponding to a wavelength, which is shorter than a wavelength at which a radiation spectrum of the active layer has a maximum value, and at which an intensity of the radiation spectrum of the active layer is 10% of the maximum value of the radiation spectrum of the active layer;
wherein the wavelength at which the radiation spectrum of the active layer has the maximum value is an infrared range.

5. A semiconductor light emitting device comprising:
an active layer for emitting light upon injection of current;
a pair of clad layers sandwiching the active layer;
a semiconductor substrate over which the active layer and the pair of clad layers are disposed;
first and second optical absorption layers, the first optical absorption layer being disposed over an upper one of the pair of clad layers, and the second optical absorption layer being provided between a lower one of the pair of clad layers and the semiconductor substrate, the light emitted by the active layer being output to outside of the semiconductor light emitting device through the first optical absorption layer, and a wavelength at which an absorption spectrum of the first optical absorption layer has a maximum value being: (i) shorter than a wavelength at which a radiation spectrum of the active layer has a maximum value, and (ii) longer than a wavelength, which is shorter than the wavelength at which the radiation spectrum of the active layer has the maximum value, and at which an intensity of the radiation spectrum of the active layer is 10% of the maximum value of the radiation spectrum of the active layer; and electrodes for injecting the current into the active layer;

wherein one of the electrodes is disposed over the first optical absorption layer and is patterned so that light generated in the active layer can be output to an outer space through the first optical absorption layer; and wherein the wavelength at which the radiation spectrum of the active layer has the maximum value is an infrared range.

6. A semiconductor light emitting device comprising:

an active layer for emitting light upon injection of current;

a pair of clad layers sandwiching the active layer, the pair of clad layers having a band gap that is wider than a band gap of the active layer;

at least one optical absorption layer disposed outside at least one clad layer of the pair of clad layers, the light emitted by the active layer being output to outside of the semiconductor light emitting device through the optical absorption layer, and the optical absorption layer having a band gap that is wider than the band gap of the active layer and narrower than the band gap of the pair of clad layers; and electrodes for injecting the current into the active layer;

wherein one of the electrodes is disposed outside the optical absorption layer and is patterned so that light generated in the active layer can be output to an outer space through the optical absorption layer;

wherein the band gap of the optical absorption layer is narrower than a band gap corresponding to a wavelength, which is shorter than a wavelength at which a radiation spectrum of the active layer has a maximum value, and at which an intensity of the radiation spectrum of the active layer is 10% of the maximum value of the radiation spectrum of the active layer;

wherein the wavelength at which the radiation spectrum of the active layer has the maximum value is an infrared range;

wherein the semiconductor light emitting device further comprises a current spreading layer between said one of the electrodes and said one clad layer of the pair of clad layers;

wherein the current spreading layer is disposed between the optical absorption layer and said one clad layer of the pair of clad layers; and wherein the active layer is made of GaAs or InGaAs, and the pair of clad layers, the current spreading layer and the optical absorption layer are made of AlGaAs.

7. A semiconductor light emitting device comprising:

an active layer for emitting light upon injection of current;

a pair of clad layers sandwiching the active layer;

at least one optical absorption layer disposed outside at least one clad layer of the pair of clad layers, the light emitted by the active layer being output to outside of the semiconductor light emitting device through the optical absorption layer, and a wavelength at which an absorption spectrum of the optical absorption layer has a maximum value being: (i) shorter than a wavelength at which a radiation spectrum of the active layer has a maximum value, and (ii) longer than a wavelength, which is shorter than the wavelength at which the radiation spectrum of the active layer has the maximum value, and at which an intensity of the radiation spectrum of the active layer is 10% of the maximum value of the radiation spectrum of the active layer; and electrodes for injecting the current into the active layer;

wherein one of the electrodes is disposed outside the optical absorption layer and is patterned so that light generated in the active layer can be output to an outer space through the optical absorption layer;

wherein the wavelength at which the radiation spectrum of the active layer has the maximum value is an infrared range;

wherein the semiconductor light emitting device further comprises a current spreading layer between said one of the electrodes and said one clad layer of the pair of clad layers;

wherein the current spreading layer is disposed between the optical absorption layer and said one clad layer of the pair of clad layers; and wherein the active layer is made of GaAs or InGaAs, and the pair of clad layers, the current spreading layer and the optical absorption layer are made of AlGaAs.

8. The semiconductor light emitting device according to claim 2, wherein a wavelength at which an absorption spectrum of the optical absorption layer has a maximum value is in a visual range.

9. The semiconductor light emitting device according to claim 2, further comprising a semiconductor substrate which absorbs the light emitted by the active layer.

10. A semiconductor light emitting device according to claim 9, wherein a first clad layer of the pair of clad layers is provided on the semiconductor substrate, and said optical absorption layer is disposed outside a second clad layer of said pair of clad layers.

11. The semiconductor light emitting device according to claim 2, further comprising a semiconductor substrate which is transparent to the light emitted by the active layer.

12. The semiconductor light emitting device according to claim 4, wherein a difference between the band gap of the active layer and the band gap of each of the first and second optical absorption layers is 0.11 eV or smaller.

13. The semiconductor light emitting device according to claim 4, wherein a wavelength at which an absorption spectrum of the first and second optical absorption layers has a maximum value is in a visual range.

14. The semiconductor light emitting device according to claim 4, wherein the semiconductor substrate is transparent to the light emitted by the active layer.

15. The semiconductor light emitting device according to claim 5, wherein a difference between a band gap corresponding to the wavelength at which the radiation spectrum of the active layer has the maximum value and a band gap of each of the first and second optical absorption layers is 0.11 eV or smaller.

16. The semiconductor light emitting device according to claim 5, wherein a wavelength at which an absorption spectrum of the first and second optical absorption layers has a maximum value is in a visual range.

17. The semiconductor light emitting device according to claim 5, wherein the semiconductor substrate is transparent to the light emitted by the active layer.

* * * * *